United States Patent [19]

Burley

[11] Patent Number: 4,834,807

[45] Date of Patent: May 30, 1989

[54] THERMOCOUPLES OF ENHANCED STABILITY

[75] Inventor: Noel A. Burley, Victoria, Australia

[73] Assignee: Bell-IRH Limited, New South Wales, Australia

[21] Appl. No.: 113,610

[22] Filed: Oct. 26, 1987

[30] Foreign Application Priority Data

Nov. 10, 1986 [AU] Australia .............................. PH8887
May 12, 1987 [AU] Australia .............................. PI1901

[51] Int. Cl.$^4$ ....................... C23C 18/06; C23C 11/00
[52] U.S. Cl. .................................... 428/457; 136/230; 136/233; 136/234; 148/20.3; 148/286; 420/443
[58] Field of Search ................ 148/6.3, 20.3; 136/230, 136/233, 134; 420/443

[56] References Cited

U.S. PATENT DOCUMENTS

4,481,043  11/1984  Steeves et al. .................... 148/20.3

FOREIGN PATENT DOCUMENTS

0078675  5/1983  European Pat. Off.
674068   6/1952  United Kingdom .
2107516  4/1983  United Kingdom .

OTHER PUBLICATIONS

Journal of Vacuum Science & Technology A, vol. 4, No. 4, Jul./Aug. 1986, Second Series, pp. 1866–1874, Woodbury, N.Y. US N.S. McIntyre et al.: "Studies of initial oxidation of nickel-chromium alloys: surface annealing by hydrogen ion bombardment."

ISA Transactions, vol. 18, No. 4, 1979, pp. 83–99, Pittsburgh, US T. P. Wang et al.: "Nicrosil–nisil thermocouples in production furnaces in the 538° C. (1,000° F.) to (1,177° C.) (2,150° F.) range."

Research Disclosure, Nov. 1984, No. 247, p. 522, abstract 24706 "Thermocouples."

Primary Examiner—Michael Lusignan
Attorney, Agent, or Firm—Armstrong, Nikaido, Marmelstein, Kubovcik & Murray

[57] ABSTRACT

A process for oxidation retardation in nickel-base thermocouple alloy comprises the step of initial heat-treatment of thermoelement wires at high temperatures in an atmosphere of very low oxygen partial pressure. The preferred nickel-base alloy is a type K or a type N alloy. The preferred atmosphere is a gas mixture selected from the group consisting of hydrogen/water vapour, and oxygen/argon.

28 Claims, 2 Drawing Sheets

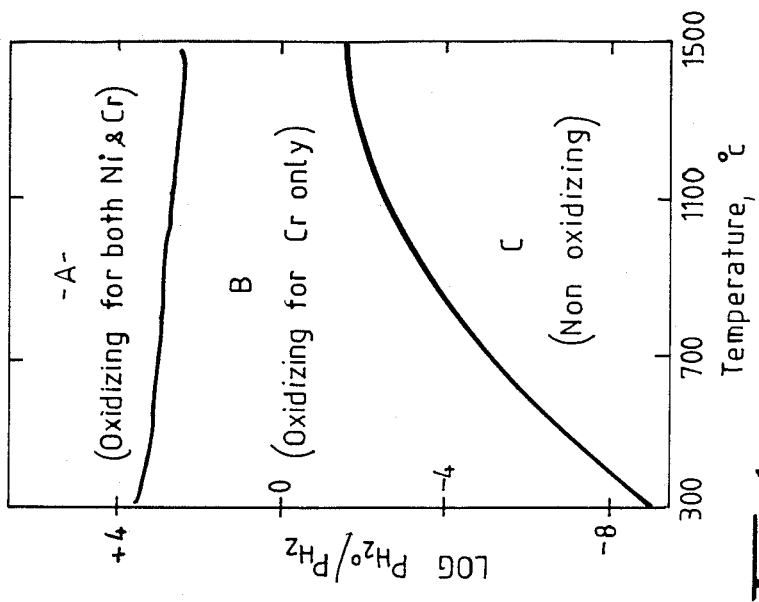
FIG. A2.
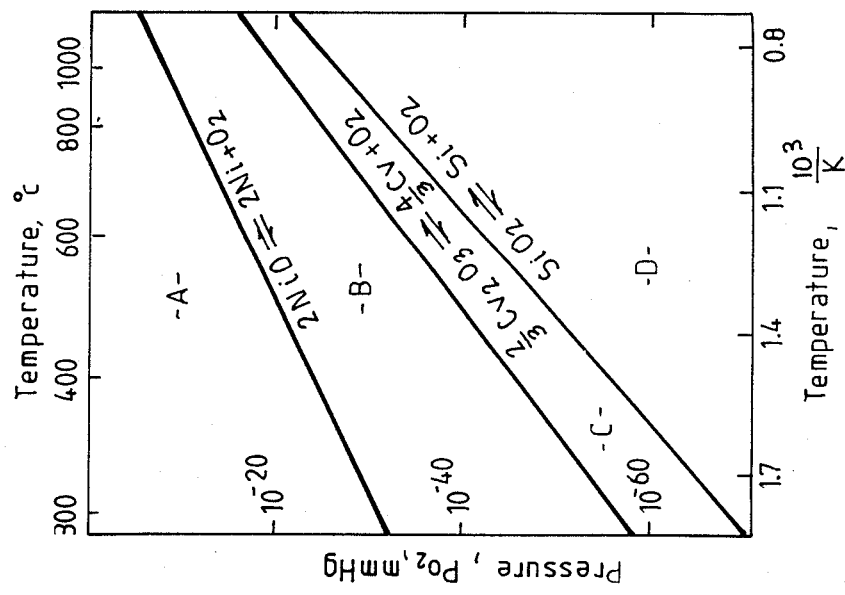
FIG. A1.

THERMOCOUPLES OF ENHANCED STABILITY

BACKGROUND OF THE INVENTION

This invention relates to mineral-insulated metal-sheathed electrically conductive cables of a novel integral design and a process for making the same.

The cables of the present invention are suitable for use as thermocouple cables, heat detectors and heating elements that are particularly useful at high temperatures. The invention utilizes nickel-base alloys as sheath materials and thermoelement conductors which have been specifically developed for the purpose. In one aspect the invention provides nickel-based thermocouple cables having enhanced thermomechanical properties, superior oxidation resistance, greater longevity and greater thermoelectric stability under longer time periods and over a range of higher temperatures up to 1300° C., than existing base-metal cables and sensor systems of the same general kind. The invention also provides electrically conductive cables including such cables suitable for use as heat detectors and heating elements.

Nickel-base alloys have been used as thermocouples since the early part of this century. An earlier and now universal nickel-base thermocouple is designated TYPE K by the Instrument Society of America (ISA). A more recent and more stable nickel-base thermocouple is designated TYPE N by the ISA. Typical nominal compositions of the thermoelement alloys which comprise these thermocouple systems are as follows:

| ALLOY (ISA symbol) | COMPOSITION (wt. %) | | | | | |
|---|---|---|---|---|---|---|
| | Cr | Mn | Al | Si | Co | Mg |
| KP | 9.3 | | | 0.4 | 0.2 | |
| NP | 14.2 | | | 1.4 | | |
| KN | | 2.8 | 2.0 | 1.0 | 0.4 | |
| NN | | | | 4.4 | | 0.2 |

The type K thermocouple is recommended to be used in an air atmosphere. At the higher temperatures (above about 1000° C.) this thermocouple fails because of its relatively poor oxidation resistance and hence poor thermoelectric stability. In contrast the type N thermocouple has greatly enhanced oxidation resistance and hence greatly enhanced thermoelectric stability up to about 1300° C.

One way in which attempts have been made to overcome the unstable performance of type K thermocouples at the highest temperatures is to incorporate them in the so-called MIMS (mineral-insulated metal-sheathed) format of a compacted ceramic-insulated thermocouple sensor assembly.

As is well known in the art, a first step in the manufacture of such thermocouple sensors is to produce the so-called MIMS cable which comprises a sheath containing one or more thermoelement conductor wires electrically insulated from the sheath (and from each other when two or more conductor wires are used) by compacted mineral insulation material.

Figure 1:
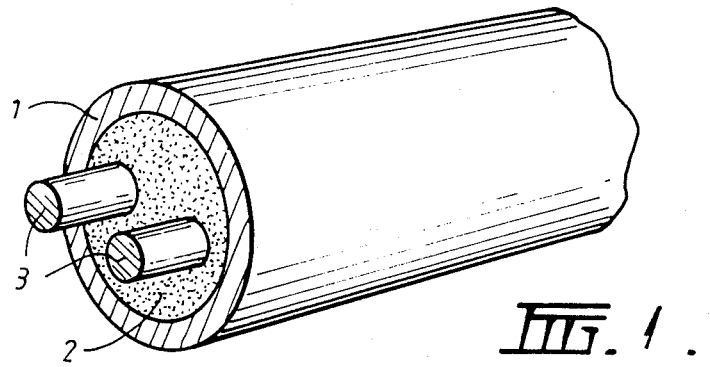
FIG. 1 illustrates a typical MIMS cable containing two conductor wires.

To make an actual sensor from a cable of the type illustrated in FIG. 1, the cable is cut and the ends of the conductors are exposed by removing some of the insulation therefrom. The exposed ends of the conductors are then joined to form a thermojunction, which may be accomplished for example by crimping and/or welding.

The thermojunction may simply be left exposed for use in appropriate environments or may be protected by capping the sheath over the thermojunction with or without insulant.

The latter type of thermocouple sensor has come into common use because it isolates the thermocouple wires from environments that may cause rapid deterioration and it provides excellent high-temperature insulation for the thermocouple conductor wires. The sheath is normally made of a material which is chosen on the basis of its compatibility with the environments and processes in which it is being used. The conventional sheath materials which are in universal use are stainless steel and Inconel (a tradename of the INCO Group of companies).

The MIMS type of construction bestows on thermocouples certain other general advantages the main of which are:

(i) physical isolation of thermoelement conductors from chemical environments that may cause rapid deterioration;

(ii) electrical isolation of thermoelement conductors from external sources of interference that may cause spurious signals;

(iii) mechanical protection of thermocouples from damage due to pressure or shock;

(iv) mechanical flexibility of assembly, allowing bending in installation; and (v) simple fabrication of thermocouples.

Because of these apparent advantages, MIMS type thermocouple sensor have more recently been fabricated to incorporate the type N thermocouple to take added advantage of the higher thermoelectric stability of the latter.

These are numerous commercial suppliers of compacted ceramic-insulated integrally-sheathed thermocouples incorporating either stainless steel or Inconel sheaths and either type K or type N thermoelement conductor wires.

At temperatures above about 1000° C. the types of compacted ceramic-insulated integrally-sheathed MIMS cables and thermocouples described above fail prematurely because of factors such as (i) the materials of which their sheaths are made, such as Inconel and stainless steel, fail by deterioration due to oxidation or other accelerated interaction with their gaseous environment;

(ii) the individual alloys of the type K thermocouple fail as a result of accelerted oxidation by low-pressure air residual in the compacted ceramic insulation;

(iii) the thermoelement conductor wires fail mechanically because of the substantial alternating strains imposed during thermal cycling. These strains are caused primarily by longitudinal stresses which arise because of substantially different temperature coefficients of linear expansion of the sheath and thermoelement materials. Some typical average values of these coefficients of expansion are:

| Component | Material | $\times 10^{-6} \,°C.^{-1} (1000° C.)$ |
|---|---|---|
| sheath | stainless steel | 21 |
| thermoalloys | type K | 17 |
| | type N | 17.5 |

(iv) the thermoelement conductor alloys are contaminated by dissolution of extraneous elements received from a different sheath alloy by thermal diffusion through the compacted insulating material (these elements, in particular manganese which diffuses in the vapour phase, can cause substantial changes in the thermoelectromotive force of the thermoelement alloys of the thermocouple);

(v) in the case of the type N thermocouple alloys, although they are highly resistant to oxidation in the low-pressure air residual in the compacted ceramic insulation they nevertheless show a relatively small drift in thermal emf in the first 100-or-so hours of exposure (this is thought to be due to one or more of several factors such as sluggish passivation of thermoalloys by oxide formation in low-pressure residual oxygen characteristic of the interstices of MIMS cable compacts, temporal fixation of residual impurity components such as carbon by reaction with emf-sensitive components of thermoalloys such as chromium, or other phenomena affecting magnitudes of thermoelectromotive force);

(vi) the thermomechanical properties such as stress-rupture and tensile strength of sheath alloys such as Inconel and stainless steel may be inadequate to withstand high operating stresses experienced in certain difficult applications (such as the measurement of temperature in gas-turbine jet-engines);

(vii) the composition of type K thermoelement conductor wires may be altered by exposure of the thermocouple to prolonged nuclear irradiation, which results in the transmutation of one or more elements in the alloy.

All these causes of failure exist because, in the past, insufficient consideration has been given to the optimum design of MIMS thermocouples as an integrated system. The choice of sheath materials and the choice of thermocouple type has been made independently. The sheath material has been chosen to match the environment and the thermoelements to match existing pyrometric instrumentation or even because of greater familiarity.

As a result, there is a pressing need for a new integral compacted ceramic-insulated cable suitable for use in the fabrication of thermocouples (or of heating elements or heat sensors) which is substantially free of the degradative influences described above and which consequently demonstrates greatly enhanced environmental and thermoelectric stabilities at temperatures up to 1300° C.

It is believed therefore that a new compacted ceramic-insulated integrally-sheathed cable of a novel integrated design, substantially free of degradative influences such as accelerated oxidation, differential thermal stresses, cross-contamination by diffusion, transmutations, and inadequate thermomechanical properties, and consequently demonstrating enhanced resistance to environmental interactions, to drift in thermoelectromotive force and in resistivity, and freedom from mechanical failure at the highest temperatures, in a variety of atmospheres, is a significant advancement in the art.

OBJECTS AND SUMMARY OF INVENTION

It is one of the objects of this invention to provide metal-sheathed mineral-insulated (MIMS) thermocouple cables and sensors of a novel integrated design which show ultra-high thermoelectric stability up to 1300° C. It is a further object of this invention to provide MIMS thermocouple cables and sensors which are highly oxidation resistant up to 1300° C. It is again a further object of this invention to provide novel sheath alloys for MIMS thermocouple cables and sensors which have thermomechanical properties which are significantly enhanced over those shown by conventional sheath materials stainless steel and Inconel. It is yet a further object of this invention to provide MIMS thermocouple cables and sensors, which are free from thermoelectric instabilities due to the compositional changes induced by transmutational effects of nuclear radiation.

It is another object of the invention to provide electrically conductive MIMS cables and heating elements which have similar advantages at high temperatures.

It is yet another object of the invention to provide electrically conductive MIMS cables and heat detectors which have similar advantages at high temperatures.

These and other objects of the invention are achieved, in one aspect of the invention, by the use of a novel method of heat-treatment of the nickel-base thermoelement alloys involved. The object of this heat-treatment process is to produce upon the surface of the thermoelement alloys passivating layers of certain oxide films which do not form exclusively when these alloys are heated normally in air. By virtue of their nearly stoichiometric composition and consequent relative freedom from ionic defects, these special passivating films will inhibit to a very high degree the counterdiffusion of metal and oxygen ions which normally react to produce the oxide degradation products of high-temperature corrosion. The oxide films which form on nickel-base thermoelement alloys when normally heated in air do not possess these diffusion inhibiting, oxidation retardant properties to anywhere near the same high degree as the special passivating films.

It is proposed that the destructive internal oxidation processes which produce massive changes in component solute concentration in ISA type K thermoelements, and consequent large changes in their thermoelectromotive forces, will be substantially inhibited by the new process of thermal passivation of thermoelement alloys for use in MIMS thermocouples.

Although the ISA type N thermoelements do not show internal oxidation when heated in air and are thus markedly more environmentally and thermoelectrically stable, they do exhibit a small thermal emf drift in the first 100-or-so hours of exposure as their own particular passivating oxide films form. It is further proposed that, although the oxide films which form on type N thermoalloys ($Cr_2O_3$, $SiO_2$) are much more efficient diffusion and oxidation inhibitors than those (NiO, $NiCr_2O_3$) which predominantly form on type K thermoalloys, nevertheless the proposed new thermal passivation process of oxidation retardation will enhance the diffusion inhibiting propensity of those films which do form normally on the type N alloys. Thus the relatively quite small degrees of thermal emf drift exhibited by type N thermocouples of MIMS form will be reduced to negligible values.

In essence, the proposed novel process for oxidation retardation in nickel-base thermocouple alloys involves an initial heat-treatment of thermoelement wires at high-temperatures in a special atmosphere of very low oxygen partial pressure. The essential scientific rationale of this new process is described more fully in Appendix 1 hereto. Although applicable to all nickel-base thermoelement alloys Appendix 1 relates particularly, by way of specific example, to oxidation inhibition in the type N alloy Nicrosil and Nisil.

The objects of this invention are achieved, in another aspect of the invention, by the use of a novel special alloy, and certain novel compositional variants of this alloy, as a sheath alloy in conjunction with the specially heat-treated thermoelement alloys mentioned above in the new MIMS cable configuration. These alloys are designed to be more oxidation resistant, stronger, more ductile, and capable of continuous operation at much higher operating temperatures, than the conventional sheath materials stainless steel and Inconel. The chemical composition tolerances (percentages by weight) for the alloying components of the preferred said special alloy are:

| Element | Concentration |
|---------|---------------|
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

The said special alloy is designed to have a single solid-solution base of Ni—Cr—Si which is strong and oxidation resistant. The oxidation resistance is enhanced by the addition of certain critical trace-quantities of Mg and Ce and of the bulk quantity of Nb to this solid solution structure.

Figure 2:
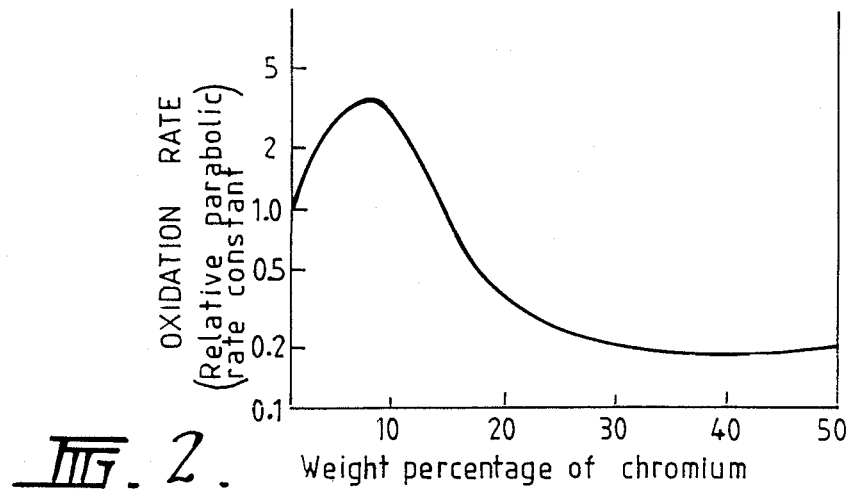
FIG. 2 illustrates the relative oxidation resistance of nickel-chromium binary alloys as will be referred to in more detail below.

Furthermore, experimental measurements have shown that the oxidation resistance of the Ni—Cr—Si base is improved by increasing the chromium content, over a wide range, above the critical internal-to-external oxidation transition composition which is about 12 weight percent. This is illustrated in FIG. 2. In relation to FIG. 2, below about this concentration (12 wt.-%) the deleterious effect of internal oxidation on quantitative oxidation rates is clearly shown. Thus the chromium content of the Ni—Cr—Si base can be broadened to cover the range 10 to 40 weight percent. Similar considerations apply to the silicon content of the Ni—Cr—Si base, so that it can be broadened to cover the range 0.5 to 5.0 weight percent silicon.

Nb has a marked effect in increasing the high-temperature strength and ductility of the Ni—Cr—Si single solid-solution base. The desired effect of strengthening at high temperatures can in fact, be achieved by a number of optional strengthening elements whose effect on the single solid-solution structure is similar to that of Nb. The solid-solution strengthening effects of niobium and of these optional elements tungsten, tantalum and molybdenum, although characterized by individual concentration-dependent maxima, are efficaceous over the whole range of their respective terminal solid solubilities in the Ni—Cr—Si alloy base. Thus their concentrations in the Ni—Cr—Si base can be broadened to cover these respective terminal solid solubility ranges. The preferred embodiments of a range of possible optional alloys is set down in Table 1.

TABLE 1

| Component Element | Alloy Option (composition - percent by weight) | | | | | |
|---|---|---|---|---|---|---|
| | 1 | 2 | 3 | 4 | 5 | 6 |
| Cr | ← 10 to 40 → | | | | | |
| Si | ← 0.5 to 5.0 → | | | | | |
| Mg | ← 0.5 maximum → | | | | | |
| Ce | ← 0.3 maximum → | | | | | |
| Mo | 1.0 to 20 | — | — | — | 1.0 | 3.0 |
| W | — | 0.5 to 25 | — | — | 0.5 | 1.0 |
| Nb | — | — | 1.0 to 10 | — | 1.0 | — |
| Ta | — | — | — | 0.5 to 8.0 | 1.0 | — |
| Ni | ← Balance → | | | | | |

The compositions of the sheath alloys in the present invention require the careful selection of component elements of very high purity and the achievement of correct proportions of each by adequate control of melting and casting techniques. In all cases the effects of one component element depend on those of the others and hence there is an interdependence of the elements within the overall composition. Thus the strengthening elements Mo, W, Nb, and Ta, when added to the preferred base alloy of the Ni—Cr—Si, in any combination, have effects one with another as stated above.

Alloys of this invention may therefore be compositionally variant in respect of the Mo, W, Nb and Ta contents to a greater degree than is indicated by the preferred embodiments described in Table 1. A second group of preferred embodiments of the alloys of this invention are therefore described as follows

| Element | Concentration (wt. %) |
|---------|----------------------|
| Cr | 10 to 40 |
| Si | 0.5 to 5.0 |
| Mg | 0.5 maximum |
| Ce | 0.3 maximum |
| Mo | 20 maximum |
| W | 25 maximum |
| Nb | 10 maximum |
| Ta | 8.0 maximum |
| Ni | remainder, apart from impurities. |

Vacuum-melted ingots of certain test alloys, whose specific compositions were chosen from within the ranges of compositions specified in Table 1, were extruded into desired shapes from which special test-pieces were machined. Tests to determine tensile strength and ductility at various temperatures were carried out using a stndard test-piece 80 mm long × 12.7 mm diameter, with a narrowed portion 32 mm long. The gauge length=5.65/A, where A=cross-sectional area of the test-piece. A KN Zwick universal testing machine, especially modified to facilitate the high-temperature tests, was used. Each test involved straining the test piece at a rate of 0.002 mm/mm/min up to the 0.5% proof stress and then at 3.2 mm/min until fracture. Ductility was assessed by measuring the elongation of the test-piece between gauge marks and the reduction of cross-sectional area of the fracture face.

The superior properties of these specific examples of alloys according to the invention are shown in the following Tables 2 and 3.

Table 4 summarizes the results of another experiment in which the base alloy was Ni—Cr—Si. The alloys of the present invention were compared with Inconel-600 and stainless steel-310. It is clear that the new MIMS sheath alloys of this invention have quite superior thermomechanical properties to the conventional sheath alloys stainless steel and Inconel.

The objects of this invention are achieved, in another aspect of the invention, by the use of novel special thermoelement conductor alloys.

The chemical compositional tolerances (percentages by weight) for the alloying components of the said special alloys are

| Positive Alloy | Elemental Component | Negative Alloy |
| --- | --- | --- |
| 14.2 ± 0.15 | Cr | 0.2 Maximum |
| 3.5 ± 0.1 | Nb | 3.5 ± 0.1 |
| 1.4 ± 0.05 | Si | 4.4 ± 0.2 |
| — | Mg | 0.15 ± 0.05 |
| 0.1 ± 0.03 | Fe | 0.1 ± 0.03 |
| 0.03 Maximum | C | 0.03 Maximum |
| balance | Ni | balance |

TABLE 2
TENSILE STRENGTHS AT ELEVATED TEMPERATURES

| Nickel-Base Alloy (wt. %) | Room | | 400 | | 600 | | 800 | | 1000 | | 1200 | |
| --- | --- | --- | --- | --- | --- | --- | --- | --- | --- | --- | --- | --- |
| | 1 | 2 | 1 | 2 | 1 | 2 | 1 | 2 | 1 | 2 | 1 | 2 |
| (Base) 14.3 Cr—1.4 Si—0.1 Mg | 498 | 211 | 550 | 143 | 423 | 136 | 178 | 86 | 67 | 25 | 27 | |
| Base + 0.5 W | 621 | 229 | 576 | 155 | 483 | 140 | 217 | 109 | 72 | | 27 | |
| Base + 3.0 Mo | 648 | 262 | 599 | 180 | 523 | 164 | 263 | 146 | 86 | | 32 | |
| Base + 3.0 Nb | 635 | 288 | 646 | 201 | 561 | 196 | 311 | 189 | 106 | | 31 | |
| Base + 1.0 Ta | 635 | 248 | 571 | 158 | 491 | 140 | 222 | 120 | 70 | | 28 | |
| Base + 1.0 Mo—1.0 Nb + 0.5 W—1.0 Ta | 651 | 258 | 585 | 170 | 513 | 145 | 278 | 155 | 84 | | 32 | |
| Base + 0.04 Ce | 618 | 229 | 553 | 143 | 465 | 135 | 200 | 102 | | | | |

Notes:
Columns 1 give Ultimate Tensile Strengths in megapascal (N.mm$^{-2}$)
Columns 2 give 0.2% Proof Stresses in megapascal (N.mm$^{-2}$)

TABLE 3
DUCTILITIES AT ELEVATED TEMPERATURES

| Nickel-Base Alloy (wt. %) | Room | | 400 | | 600 | | 800 | | 1000 | | 1200 | |
| --- | --- | --- | --- | --- | --- | --- | --- | --- | --- | --- | --- | --- |
| | 1 | 2 | 1 | 2 | 1 | 2 | 1 | 2 | 1 | 2 | 1 | 2 |
| (Base) 14.3 Cr—1.4 Si—0.1 Mg | 28 | 33 | 51 | 68 | 38 | 45 | 52 | 37 | 97 | 73 | 126 | 90 |
| Base + 0.5 W | 49 | 73 | 53 | 77 | 41 | 47 | 80 | 63 | 117 | 71 | 125 | 100 |
| Base + 3.0 Mo | 55 | 72 | 56 | 73 | 57 | 62 | 104 | 73 | 74 | 51 | 112 | 81 |
| Base + 3.0 Nb | 53 | 61 | 58 | 67 | 60 | 66 | 91 | 71 | 108 | 70 | 135 | 98 |
| Base + 1.0 Ta | 51 | 74 | 56 | 70 | 52 | 68 | 39 | 33 | 110 | 65 | 112 | 100 |
| Base + 1.0 Mo—1.0 Nb—0.5 W—1.0 Ta | 55 | 79 | 58 | 75 | 54 | 69 | 52 | 40 | 53 | 62 | 110 | 100 |
| Base + 0.04 Ce | 50 | 64 | 49 | 68 | 37 | 36 | 19 | 36 | | | | |

Notes:
Columns 1 give Ductilities by elongation (%)
Columns 2 give Ductilities by reduction in cross-sectional area (%)

TABLE 4

| ALLOY IDENT. | COMPOSITION (weight %) | ULTIMATE TENSILE STRENGTH (N. mm$^{-2}$) at 800° C. | % increase/decrease (+) (−) |
| --- | --- | --- | --- |
| NPX-X | Base alloy (Ni—14.2 Cr—1.4 Si) | 175 | |
| NPX-1 | Base + 0.5 W | 217 | +24 |
| NPX-2 | Base + 3.0 Mo | 263 | +50 |
| NPX-3 | Base + 3.0 Nb | 311 | +78 |
| NPX-4 | Base + 1.0 Ta | 222 | +43 |
| NPX-5 | Base + 1.0 Mo + 0.5W + 1.0Nb + 1.0 Ta | 278 | +27 |
| SS 310* | Fe—25 Cr—20 Ni—2.0 Mn—1.5 Si | 205 | +17 (Base) −34 (NPX-3) |
| INC 600* | (Ni + Co)—16Cr—7½ Fe—1.0 Mn—½ Si—½ Cu | 135 | −23 (Base) −57 (NPX-3) |

*SS 310 = stainless steel 310
INC 600 = Inconel 600

The said special alloys are designed to eliminate two deleterious effects which cause thermoelectric instability in nickel-base thermocouples in MIMS format.

One of these effects is that thermoelement conductor wires incorporated in conventional MIMS thermocouples are contaminated by dissolution of extraneous elements received from a different sheath alloy by thermal diffusion through the compacted insulating material. These elements, in particular manganese which diffuses in the vapour phase, can cause substantial changes in the thermal emf outputs of the thermocouples by virtue of their resultant changes in solid-solution composition.

Neither the new sheath alloys of this invention, nor type N thermoalloys, nor 'special' grades of type K thermoalloys contain any manganese, so that contamination by maganese from these sources is not possible.

However, the new sheath alloys of this invention contain, for example, 3.5 percent of niobium, and this element is a candidate for contamination of type N thermoelements by cross-diffusion. Whilst such contamination is unlikely by vapour phase transfer because of the very low vapour pressure of niobium, solid state transfer could occur. Such a possibility is eliminated, however, by the use of the new thermoelement alloys because they contain concentrations of niobium equal to that of the new sheath alloys. Since the chemical potential gradient for niobium between the preferred sheath alloy and the preferred thermoelement alloys of this invention is thus eliminated, this powerful driving force for cross diffusion in the MIMS thermocouple format is non-existent. Consequently, instability in thermoelectromotive force in the new MIMS thermocouple of this invention, due to this cause, is obviated.

It may be desired to retain thermal emf outputs equivalent to those of type N thermocouples in MIMS thermocouples fabricated from the preferred thermoalloys of this invention. This could be done, for example, by variation of the chromium content of each alloy within certain and well-defined critical limits. The chemical compositional tolerances (percentages by weight) for the alloying components of such modified alloys are:

| Positive Alloy | Elemental Component | Negative Alloy |
|---|---|---|
| 14.2 ± 1.0 | Cr | 1.0 maximum |
| 3.5 ± 0.1 | Nb | 3.5 ± 0.1 |
| 1.4 ± 0.05 | Si | 4.4 ± 0.2 |
| — | Mg | 0.15 ± 0.05 |
| 0.1 ± 0.03 | Fe | 0.1 ± 0.03 |
| 0.03 maximum | C | 0.03 maximum |
| balance | Ni | balance |

The compositions of the thermocouple alloys in the present invention require the careful selection of component elements of very high purity and the achievement of correct proportions of each by adequate control of melting and casting techniques. In both the positive and negative thermocouple alloys the effects of one component element depend on those of the others and hence there is an interdependence of the elements within the overall composition. Thermocouple alloys of this invention may therefore be compositionally variant in respect of their Cr, Si, and Nb contents to a greater degree than is indicated by the preferred embodiments described above. The broad chemical compositional tolerances for the thermocouple alloys of this invention are therefore as follows (in percentages by weight).

| Positive Alloy | Elemental Component | Negative Alloy |
|---|---|---|
| 10 to 25 | Cr | 2.0 maximum |
| 1.0 to 10 | Nb | 1.0 to 10 |
| 0.5 to 5.0 | Si | 2.0 to 5.0 |
| 0.5 maximum | Mg | 0.5 maximum |
| 0.1 ± 0.03 | Fe | 0.1 ± 0.03 |
| 0.03 maximum | C | 0.03 maximum |
| balance | Ni | balance |

Another of the effects which cause thermoelectric instability in nickel-base thermocouples in MIMS format is a short-term drift in thermal emf of significant magnitude, occurring in the first 100-or-so hours of exposure of high-temperature.

A contributing cause advanced to explain this phenomenon is a change in major solute concentrations caused by initial sluggish reactions between such solutes and certain impurity elements residual in the alloys from manufacture. For example, the major solute chromium could react slowly with carbon to precipitate chromium carbide from solid solution in the alloy, with a concomitant change in thermoelectromotive force.

This problem could be overcome if the thermoalloys contained a minor addition of a further element which has a greater affinity for carbon that the major solutes. A rapid reaction between the additional minor more-reactive element and carbon during a preliminary heating would serve to 'lock-in' the latter element as a stable carbide prior to initial calibration of the thermocouple. Initial thermal emf changes due to this cause would therefore not be manifest in subsequent exposure of the thermocouple at high temperature. Such a reactive element is the niobium proposed for inclusion in each of the novel proposed thermoalloys of this invention.

As detailed above, there are several factors which cause compacted ceramic-insulated integrally-sheathed thermocouples to fail prematurely at high temperatures. This malaise exists because no consideration has hitherto been given to the optimum design of MIMS thermocouple as an integrated system. The choice of sheath material and the choice of thermocouple type has been made independently.

Figure 3:
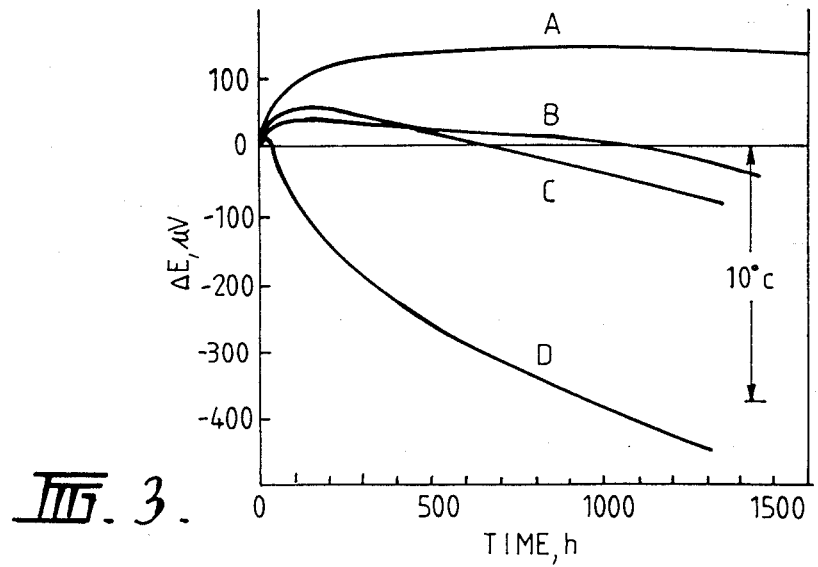
FIG. 3 illustrates the superior thermoelectrical stability of thermocouples according to the invention as will be referred to in more detail below; and FIGS. A1 and A2 illustrate thermodynamic data referred to in the Appendix.

The present invention combines several novel features which, although different in character, represent a complete whole in the form of the first MIMS thermocouple to be designed as an integrated system. This system comprises novel sheath elements and novel thermocouple conductors, and a novel passivating heat-treatment which stabilizes the thermoelements prior to use. That this integrated design of MIMS thermocouple produces a base-metal thermocouple which is thermoelectrically more stable than those of conventional design is illustrated in FIG. 3.

The elimination of premature failure and the ultra-high thermoelectric stability which characterize the present invention results from the use of sheath alloys and conductor thermoalloys which are of enhanced oxidation resistance up to 1300° C., and of enhanced thermomechanical properties. This eliminates the excessive oxidation of conventional sheath materials, the consequent excessive drift in thermoelectromotive force, and premature mechanical failures. Because sheaths and thermocouples are of identical or essentially similar composition, chemical contamination and fatigue failure of dissimilar conductor alloys is virtually eliminated. Short and long-term thermal emf drift in nickel-base thermocouples of MIMS construction is attenuated by the novel heat-treatment process, and nuclear transmutation effects are attenuated in the new MIMS construction by the absence of readily transmutable elements like Cobalt and Manganese from all compositions. The invention will be further illustrated by the following non-limiting examples:

EXAMPLE 1

The integral compacted thermocouple cable of this Example is fabriciated using existing manufacturing procedures. They begin with thermoelectrically matched thermoelement wires surrounded by non-compacted ceramic insulating material held within a metal tube. By drawing, swaging, or other mechanical reduction processes the tube is reduced in diameter and the insulation is compacted around the wires. The manufacturing process parameters are adjusted so that the ratios of sheath diameter to wires-size and sheath wall-thickness offer a balance between maximum wall-thickness and suitable insulation spacing for effective insulation resistance at elevated temperatures.

An important feature of the fabrication process is that considerable attention is given to the initial cleanliness and chemical purity of the components and retention of a high degree of cleanliness and dryness throughout fabrication. As already noted above, to make an actual sensor from this cable, the cable is cut and the ends of the conductors are exposed by removing some of the insulation therefrom. The exposed ends of the conductors are then joined to form a thermojunction, which may be accomplished for example by crimping and/or welding.

The thermojunction may simply be left exposed for use in appropriate environments, or may be protected by capping the sheath over the thermojunction with or without insulant. The measuring thermojunction of the thermocouple is usually, but not always, electrically isolated from the end of the sheath.

In this example, the alloys for the thermocouple conductor wires are those specified above as

| Positive Alloy (wt. %) | Elemental Component | Negative Alloy (wt. %) |
| --- | --- | --- |
| 14.2 | Cr | 0.2 maximum |
| 3.5 | Nb | 3.5 |
| 1.4 | Si | 4.4 |
| — | Mg | 0.15 |
| 0.1 | Fe | 0.1 |
| 0.03 maximum | C | 0.03 maximum |
| balance | Ni | balance | and the alloy for the sheath is that specified above as

| Element | Concentration (wt. %) |
| --- | --- |
| Cr | 14.0 |
| Nb | 3.5 |
| Si | 1.4 |
| Mg | 0.15 |
| Ce | 0.05 |
| Ni | balance |

An important feature of the finished product of this example is that the essential similarity between the sheath alloy and the thermocouple conductor alloys virtually eliminates the destructive influences of thermocouple contamination by cross-diffusion, mechanical failure due to differential thermal stresses, and accelerated oxidation above about 1050° C. The strains caused by longitudinal stresses arising during thermal cycling are small because of the very small differences in the temperature coefficients of lineal expansion between the materials of the sheath and of the thermoelement conductors. Some typical average values of these coefficients of expansion are

| Component | $\times 10^{-6}\,°C.^{-1}(1000°\ C.)$ |
| --- | --- |
| sheath | 18 |
| thermoalloys | 17.5 (average of positive and negative) |

A further important feature of the finished product of this example is that the thermocouple conductor wires shall have been stabilized, prior to incorporation in the fabricated MIMS cable, by the novel stabilization technique described in detail in Appendix 1 hereto.

EXAMPLE 2

The integral compacted thermocouple cable and sensor of this example is the same as that described in Example 1, except that the alloys for the thermocouple conductor wires will be the thermocouple conductor wires of Example 1 but modified in composition to give outputs of a type N thermocouple as sepcified by the U.S. National Bureau of Standards. Such modified thermocouple conductor wires are those specified above as

| Positive Alloy (wt. %) | Elemental Component | Negative Alloy (wt. %) |
| --- | --- | --- |
| 11 to 17 | Cr | 1.0 maximum |
| 3.5 | Nb | 3.5 |
| 1.4 | Si | 4.4 |
| — | Mg | 0.2 |
| 0.1 | Fe | 0.1 |
| 0.03 maximum | C | 0.03 maximum |
| balance | Ni | balance |

EXAMPLE 3

The integral compacted thermocouple cable and sensor of this example is the same as that described in Example 1, except that the alloys for the thermocouple conductor wires will be such as to give the thermoelectromotive force outputs of a type K thermocouple, as specified by the U.S. National Bureau of Standards, but modified in composition to eliminate the presence (and the consequent deleterious influences on stability of thermoelectromotive force) of manganese, as described above, in both alloys. Such modified thermocouple conductor wires are of composition

| Positive Alloy (wt. %) | Elemental Component | Negative Alloy (wt. %) |
| --- | --- | --- |
| 9.3 | Cr | — |
| 0.4 | Si | 2.5 |
| 0.4 | Fe | 0.4 |
| Nil | Mn | Nil |
| balance | Ni | balance |

It will be clearly understood that we do not wish to be limited by any postulated or hypothetical mechanism for the observed beneficial effects of the present invention. Subject to the foregoing consideration, the following Appendix 1 sets out what we believe to be the essential scientific rationale of the invention.

APPENDIX 1

Novel Stabilization Technique for Nickel-Base Thermocouple Alloys

1. Background

Nicrosil, Nisil, and certain related alloys are thermodynamically stable at elevated temperatures because they form special oxide films which are virtually impervious to penetration by metal and gas ions. It is this penetration by diffusion which is pre-requisite for the propagation of high-temperature gas corrosion processes such as oxidation.

These oxide films, which are based on chromium, silicon and magnesium (e.g. $Cr_2O_3$, $SiO_2$, $Mg_2SiO_3$), form quickly in air at elevated temperatures. Thus bare type N alloys are naturally fairly well passivated early in their lives. In the mineral-insulated integrally-sheathed (MIMS) form of thermocouple, this passivation process is retarded somewhat due to limitations in the rate of the supply of oxygen to the thermoelement conductor wires.

Although the long-term thermoelectromotive force stability of a MIMS type N thermocouple at high temperatures is characteristic of a rare-metal thermocouple, there is an initial (about 100-hour) drift in thermal emf which is about five to ten times greater in magnitude than the total longer-term value. This is undesirable.

The diagram illustrates this behaviour.

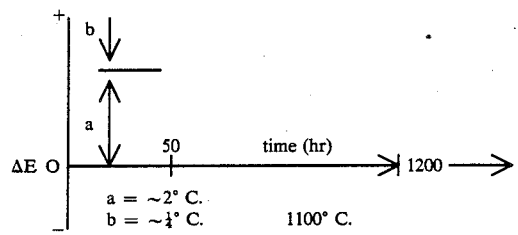

Clearly, if this early thermal-emf drift can be eliminated, or minimized to be about equal to the longer-term drift, then type N MIMS thermocouples of 'Class 0.1%' long-term accuracy are feasible.

2. Proposal

It is proposed that if type NP (Nicrosil) and type NN (Nisil) thermocouple wires are thermally passivated by a special accelerated process prior to incorporation in MIMS type N format, then the initial drift in thermal emf apparent at high-temperatures in present-day type N thermocouples will virtually be eliminated. It is further proposed that this novel technique, which is especially designed for type N and related alloys, would achieve these desirable aims.

As is evident below, the new technique is of a practical character industrially, and is capable of ready adaption to conventional atmosphere-controlled heat-treatment enclosures including those utilized by manufacturers of MIMS cables.

3. The Process

The novel stabilization process is a newly proposed technique for enhancing the initial oxidation resistance of type N and related alloys at temperatures up to 1300° C. The process, therefore, stabilizes the initial solute concentrations in the alloy concerned and hence its thermoelectromotive force output. It is based upon the concept that the initial high-temperature oxidation resistance of a metallic material is primarily dependent upon the degree to which its initial oxide scale inhibits the counterdiffusion of the species reacting to produce it (metal ions outwards and oxygen ions inwards). Properties of protective scales, therefore, must include a minimal concentration of ionic defects which affect transport through it, a high density, and freedom from pores and/or cracks which allow short-circuit diffusion. Other necessary properties include low vapour pressure and low reactivity with a particular environment.

The new technique is aimed at producing initial protective oxides which exhibit these properties to the highest possible degree. Analysis of the problem indicates that the following procedures are involved (a) identification of a solute component element which will produce, in the relevant ranges of temperature and oxygen partial pressure, a stable and inert oxide of near stoichiometric composition;

(b) calculation of the theoretical critical concentration of the selected solute at which the transition from internal to external modes of oxidation will occur, i.e. the concentration above which the oxide of this solute will form only on the surface of the alloy; and, (c) determination of the parameters of the regimes of high-temperatures and low oxygen pressures within which exclusive selective oxidation will occur to produce (in a special thermal pre-treatment) a single passive thin-film of the preferred surface oxide.

3.1 Identification of a Suitable Oxide

The first requirement is that the oxide will have high thermodynamic stability, of which its negative free energy of formation is the measure. The table below lists oxides of interest in magnitude order of this energy. It will be seen that cerium, magnesium, silicon and chromium, the important actual (or potential in the case of cerium) solute components of the type N alloys nicrosil and nisil, all form oxides having high negative free energy of formation values relative to the base nickel.

| Oxide | Free Energy of formation at 25° C. kJ mol $0^{-1}$ | Electrical Conductivity at 1000° C. $ohm^{-1} cm^{-1}$ |
| --- | --- | --- |
| CaO | −603 | $10^{-4}$ |
| $ThO_2$ | 579 | $10^{-3}$ |
| $Ce_2O_3$ | 562 | |
| BeO | 559 | $10^{-7}$ |
| MgO | 558 | $2 \times 10^{-7}$ |
| $Y_2O_3$ | 546 | |
| $HfO_2$ | 517 | |
| $Al_2O_3$ | −516 | $10^{-7}$ |
| $ZrO_2$ | 509 | $10^{-5}$ |
| $TiO_2$ | 435 | $2 \times 10^{-2}$ |
| $SiO_2$ | 419 | $10^{-6}$ |
| $Ta_2O_5$ | 386 | |
| $Cr_2O_3$ | 341 | $2 \times 10^{-1}$ |
| FeO | −263 | $5 \times 10^3$ |
| NiO | 238 | $10^{-2}$ |
| CoO | 234 | $10^{-1}$ |
| $Cu_2O$ | 164 | $5 \times 10^2$ |

Second, the ability of an oxide to inhibit the counterdiffusion of species reacting to produce it (i.e. to inhibit oxidation) is largely governed by the concentration of its point defects such as vacancies. Highly stoichiometric oxides, which have low defect concentration, are the most inhibitive of diffusion. The defect concentration in an oxide is proportional to its electrical conductivity, which reflects the mechanism of diffusion by ionic and electronic transport. The table above also classifies the oxides of interest in terms of their electrical conductivities. It will be seen that the oxides which are produced by the major solute-element components of type N alloys, namely. $Cr_2O_3$, MgO, and $SiO_2$, all have extremely low conductivities relative to those of the base alloy nickel. It is particularly to be noted that the oxide of the major solute chromium $Cr_2O_3$, has only a moderately low conductivity.

32. Transition Concentration: Internal to External Oxidation

The second major requirement for the new stabilization process is that the high-stability oxide chosen must form exclusively on the surface to act as a highly efficacious diffusion barrier. It is thus necessary to calculate the theoretical critical concentration of the selected solute at which the transition from internal to external modes of oxidation occur.

The basic method of calculation of this critical concentration, $N_B$, of binary solute B in the dilute solid solution alloy A-B (for example, nisil, Ni-4Si) above which, at a given temperature and pressure of oxygen, its oxide is formed exclusively on the surface, is given by the relationship $$N_B = L(k_p/D)^\S$$

where
 $k_p$ = the parabolic rate constant for the exclusive formation of B oxide
 D = diffusion coefficient of B in the alloy
 L = (a constant) = $(V)/Z_B M_O$
where
 V = molar volume of the alloy
 $Z_B$ = valence of solute atoms
 $M_O$ = atomic weight of oxygen Using this relationship for some important solutes in high-temperature alloys and for the base nickel, it is found that for the three binary alloy systems listed below the critical internal/external oxidation transition concentrations (in air at 1000° C.) are

|       | atoms percent | weight percent |
|-------|---------------|----------------|
| Ni—Cr | 12            | 13§            |
| Ni—Al | 9             | 3§             |
| Ni—Si | 8             | 4              |

It can be seen that type N thermocouple alloys have major solute concentrations higher in chromium (14.2) and silicon (4.4) than those values calculated above. Nicrosil and nisil are hence potentially able to be thermally passivated.

3.3 Exclusive Preferential Oxidation

The third procedure in the new stabilization process involves the actual production of the chosen, stable, inert and highly stoichiometric oxide layer as a discrete passive film exclusively on the surface of the alloy. This requires a determination of the parametric bounds of high temperature and low oxygen pressure within which the chosen oxide film will form preferentially to the exclusion of all others. In particular it is required to suppress the formation of the non-passivating oxides of nickel, NiO and $NiCr_2O_4$.

It is proposed that the formation of the unwanted oxides NiO and $NiCR_2O_4$ can be suppressed by an initial thermal-treatment under certain controlled conditions (of temperatures and pressure) which are specifically favorable to the exclusive formation of $Cr_2O_3$ and/or $SiO_2$. What follows below are the theoretical bases for such a proposal for the case of the alloy system Ni—Cr—Si (which includes Nicrosil). The theory is equally applicable to the case of the system Ni-Si (which includes Nisil).

If a Ni—Cr—Si alloy is heated in an abundant supply of air, the three components of the alloy will oxidize at different rates which are dependent initially upon the differences in the standard free energies of formation of their respective oxides. If, however, the oxygen potential of the reacting gas is progressively lowered, say by reducing its total pressure or by changing its composition, the selective oxidation of chromium with respect to nickel, and of silicon with respect to both chromium and nickel, is enhanced. This means that the oxidation of nickel can be suppressed whilst that of chromium and silicon continues, next the oxidation of nickel and chromium can be suppressed whilst that of silicon continues, and finally the oxidation of all three alloy components can be suppressed. Such a lowering of the oxygen pressure will also lead, successively, to the dissociation of any NiO, $Cr_2O_3$, and $SiO_2$ already formed. FIG. A1, which has been calculated from heats of decomposition and entropy data, shows the partial pressure of oxygen in equilibrium with the relevant oxides of nickel, chromium and silicon, at temperatures up to about 1000° C. If the partial pressure of oxygen and the temperature are such that conditions correspond to the area marked A, the atmosphere will be oxidizing to all three reactions. If, however, the condition lies around B it will be seen that the oxygen partial pressure has fallen below the equilibrium pressure for the reaction

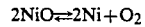

$$2NiO \rightleftharpoons 2Ni + O_2$$

and thus the equilbrium $$K = C[Ni] \times P_{O_2}/C[NiO]$$

is disturbed by a lowering of $P_{O_2}$, and a decrease in C[NiO] will occur to restore the equilibrium, i.e. the reaction will go to the right and no oxidation of nickel will occur. The oxygen partial pressure is, however, greater than the equilibrium value for the reactions

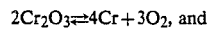

$$2Cr_2O_3 \rightleftharpoons 4Cr + 3O_2, \text{ and}$$

$$SiO_2 \rightleftharpoons Si + O_2,$$

both of which will accordingly go to the left and the oxidation of chromium and silicon only will take place. When the condition lies around C both the nickel and chromium reactions will go to the right and the exclusive oxidation of silicon will take place. When the condition lies around D all three reactions will go to the right and the surface will remain bright. From FIG. A1 it will further be seen that, at any given partial pressure, increasing the temperature brings the condition closer to the equilibrium state and will thus tend towards the suppression of one reaction and the enhancement of the selective effect.

Thus, in theory the deleterious effects of the initial formation of NiO and $NiCrO_4$ in the transient oxidation of type N alloys can be eliminated by preliminary thermal treatments at specific controlled temperatures and pressures in which the exclusive formation of $Cr_2O_3$ and/or $SiO_2$ would occur. This could involve lowering the oxygen pressure to around D in FIG. A1, at some suitable temperature, and raising it again to around C, or B, as appropriate.

4. Practical Considerations

It is at once obvious that the very low oxygen pressures required in the new stabilization techniques cannot be obtained in industrial vacuum furnaces. These ultra-low partial pressures of oxygen might just be achievable, however, in oxygen/argon mixtures. What is quite clear, though, is that the conditions for the dissociation of $Cr_2O_3$, and hence the exclusive preferential formation of $SiO_2$, could readily be achieved with mixtures of hydrogen and water vapour (a practical industrial atmosphere), according to the reaction:

$$2Cr + 3H_2O \rightleftharpoons Cr_2O_3 + 3H_2$$

This equilibrium situation is summarized in FIG. A2, where zone C is the $Cr_2O_3$ dissociation zone.

It is to be noted that the thermodynamic data presented in FIGS. A1 and A2 relate to theoretical equilibrium conditions. These data give little of no indication of the kinetics (rates) of the reactions. Therefore under practical industrial conditions, temperatures and oxygen pressures required to successfully apply the new technique may be somewhat different to those shown in the Figures. Some preliminary trials would be necessary to determine optimum parameters.

In actual industrial practice, it would be necessary to maintain close control over the three variable factors temperature, oxygen pressure and total pressure of the reacting gas. Such control is quite practicable with modern-day microprocessor control instrumentation and using existing types of atmosphere control furnace.

It is suggested that the long-term efficacy of the new technique would be enhanced if the MIMS cables fabricated from passivated type N wires were back-filled with an inert gas such as nitrogen.

The sheath alloys of finished MIMS cables of this invention could also be thermally passivated by the novel process to give better oxidation resistance and hence greater longevity.

5. Summary

A specific process of thermal passivation is proposed, which will stabilize the initial thermal emf stability of type N and other nickel-base thermocouples, particularly those of MIMS format. This stabilization is achieved by the application of a special initial heat-treatment process favourable to exclusive preferential oxidation to form selected surface oxide films with optimum diffusion inhibiting propensity.

This process would involve special atmospheres of oxygen/argon or oxygen/water-vapour mixtures, ultra-low oxygen partial pressures, and elevated temperatures. The proposed process is considered to be quite suitable for practical application.

It will be clearly understood that the invention in its general aspects is not limited to the specific details referred to hereinabove.

I claim:

1. A process for oxidation retardation in nickel-based thermocouple alloys, comprising the steps of:
   (a) forming a thermoelement wire from a nickel-based alloy;
   (b) subjecting the thermoelement wire to heat treatment at high temperature in an atmosphere of very low oxygen partial pressure;
   (c) allowing the thermoelement wire to cool; and
   (d) recovering the thermoelement wire.

2. A process according to claim 1, wherein the nickel-based alloy is one selected from the group consisting of type K alloy and type N alloy.

3. A process according to claim 1, wherein the atmosphere is a gas mixture selected from the group consisting of hydrogen/water vapour and oxygen/argon.

4. A process according to claim 1, wherein the partial pressure of oxygen is in the range of $10^{-70}$ to $10^{-10}$ mm Hg.

5. A process according to claim 1, wherein the temperature is approximately 1300° C.

6. A process according to claim 1, wherein the atmosphere is defined by the logarithm of the ratio of the partial pressure of water vapour to the partial pressure of hydrogen, $\log P_{H_2O}/P_{H_2}$, is in the range plus 6 to minus 9.

7. A mineral insulated, metal-sheathed (MIMS) cable comprising a thermoelement wire and an alloy sheath, said thermoelement wire being treated by a process, comprising the steps of:
   (a) forming a thermoelement wire from a nickel-based alloy;
   (b) subjecting the thermoelement wire to heat treatment at high temperature in an atmosphere of very low oxygen partial pressure;
   (c) allowing the thermoelement wire to cool; and
   (d) recovering the thermoelement wire.

8. A MIMS cable according to claim 7, wherein the sheath alloy has the following composition:

| Element | Concentration (wt. %) |
| --- | --- |
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

9. A MIMS cable according to claim 7, wherein the sheath alloy has the following composition, expressed as weight-%: chromium 10 to 40, silicon 0.5 to 5.0, magnesium 0.5 maximum, cerium 0.5 maximum, molybdenum 1.0 to 20, tungsten 0.5 to 25, niobium 1.0 to 10.0, tantalum 0.5 to 0.8, and the balance nickel.

10. A MIMS cable according to claim 7, wherein the sheath alloy has the following composition, expressed as weight-%: chromium 13.5 to 14.5, silicon 1.0 to 1.5, magnesium 0.2 maximum, cerium 0.2 maximum, molybdenum 1.0 to 5.0, tungsten 0.5 to 3.0, niobium 1.0 to 5.0, tantalum 1.0 to 4.0, and the balance nickel.

11. A MIMS cable according to claim 7, wherein the sheath alloy has the following composition:

| Element | Concentration (wt. %) |
| --- | --- |
| Cr | 10 to 40 |
| Si | 0.5 to 5.0 |
| Mg | 0.5 maximum |
| Ce | 0.3 maximum |
| Mo | 20 maximum |
| W | 25 maximum |
| Nb | 10 maximum |
| Ta | 8.0 maximum |
| Ni | balance |

12. A MIMS cable according to claim 7, wherein the sheath alloy has the following composition:

| Element | Concentration (wt. %) |
| --- | --- |
| Cr | 13.5 to 14.5 |
| Si | 1.0 to 1.8 |
| Mg | 0.5 maximum |
| Ce | 0.5 maximum |
| Mo | 5.0 maximum |
| W | 3.0 maximum |
| Nb | 5.0 maximum |
| Ta | 4.0 maximum |
| Ni | balance |

13. A thermocouple comprising a mineral insulated, metal-sheathed (MIMS) cable defined by a thermoelement conductor and an alloy sheath, said thermoelement conductor being treated by a process, comprising the steps of:
(a) forming a thermoelement wire from a nickel-based alloy;
(b) subjecting the thermoelement wire to heat treatment at high temperature in an atmosphere of very low oxygen partial pressure;
(c) allowing the thermoelement wire to cool; and
(d) recovering the thermoelement wire,
wherein said thermoelement conductor has the following composition, expresses as weight-%:

| Positive Alloy | Elemental Component | Negative Alloy |
|---|---|---|
| 10 to 25 | Cr | 2.0 maximum |
| 1.0 to 10 | Nb | 1.0 to 10 |
| 0.5 to 5.0 | Si | 2.0 to 5.0 |
| 0.5 maximum | Mg | 0.5 maximum |
| 0.1 ± 0.03 | Fe | 0.1 ± 0.03 |
| 0.03 maximum | C | 0.03 maximum |
| balance | Ni | balance |

14. A thermocouple according to claim 13, wherein the thermoelement conductor has the following composition, expressed as weight-%:

| Positive Alloy | Elemental Component | Negative Alloy |
|---|---|---|
| 14.2 ± 1.0 | Cr | 1.0 maximum |
| 3.5 ± 0.1 | Nb | 3.5 ± 0.1 |
| 1.4 ± 0.05 | Si | 4.4 ± 0.2 |
| — | Mg | 0.15 ± 0.05 |
| 0.1 ± 0.03 | Fe | 0.1 ± 0.03 |
| 0.03 maximum | C | 0.03 maximum |
| balance | Ni | balance |

15. A thermocouple according to claim 13, wherein the thermoelement conductor has the following composition, expressed as weight-%:

| Positive Alloy | Elemental Component | Negative Alloy |
|---|---|---|
| 14.2 ± 0.15 | Cr | 0.2 maximum |
| 3.5 ± 0.1 | Nb | 3.5 ± 0.1 |
| 1.4 ± 0.05 | Si | 4.4 ± 0.2 |
| — | Mg | 0.15 ± 0.05 |
| 0.1 ± 0.03 | Fe | 0.1 ± 0.03 |
| 0.03 maximum | C | 0.03 maximum |
| balance | Ni | balance |

16. A thermocouple according to claim 13, wherein the cable is back filled with an inert gas after removal of residual air.

17. A process according to claim 2, wherein the atmosphere is a gas mixture selected from the group consisting of hydrogen/water vapour and oxygen/argon.

18. A process according to claim 2, wherein the partial pressure of oxygen is in the range of $10^{-70}$ to $10^{-10}$ mm Hg.

19. A process according to claim 3, wherein the partial pressure of oxygen is in the range of $10^{-70}$ to $10^{-10}$ mm Hg.

20. A process according to claim 2, wherein the temperature is approximately 1300° C.

21. A process according to claim 3, wherein the temperature is approximately 1300° C.

22. A process according to claim 4, wherein the temperature is approximately 1300° C.

23. A heating element comprising a mineral insulated, metal-sheathed (MIMS) cable defined by a thermoelement conductor and an alloy sheath, said thermoelement conductor being treated by a process, comprising the steps of:
(a) forming a thermoelement wire from a nickel-based alloy;
(b) subjecting the thermoelement wire to heat treatment at high temperature in an atmosphere of very low oxygen partial pressure;
(c) allowing the thermoelement wire to cool; and
(d) recovering the thermoelement wire,
wherein said thermoelement conductor has the following composition, expresses as weight-%:

| Positive Alloy | Elemental Component | Negative Alloy |
|---|---|---|
| 10 to 25 | Cr | 2.0 maximum |
| 1.0 to 10 | Nb | 1.0 to 10 |
| 0.5 to 5.0 | Si | 2.0 to 5.0 |
| 0.5 maximum | Mg | 0.5 maximum |
| 0.1 ± 0.03 | Fe | 0.1 ± 0.03 |
| 0.03 maximum | C | 0.03 maximum |
| balance | Ni | balance |

24. A heat detector comprising a mineral insulated, metal-sheathed (MIMS) cable including a thermoelement conductor and an alloy sheath, said thermoelement conductor being treated by a process, comprising the steps of:
(a) forming a thermoelement wire from a nickel-based alloy;
(b) subjecting the thermoelement wire to heat treatment at high temperature in an atmosphere of very low oxygen partial pressure;
(c) allowing the thermoelement wire to cool; and
(d) recovering the thermoelement wire,
wherein said thermoelement conductor has the following composition, expresses as weight-%:

| Positive Alloy | Elemental Component | Negative Alloy |
|---|---|---|
| 10 to 25 | Cr | 2.0 maximum |
| 1.0 to 10 | Nb | 1.0 to 10 |
| 0.5 to 5.0 | Si | 2.0 to 5.0 |
| 0.5 maximum | Mg | 0.5 maximum |
| 0.1 ± 0.03 | Fe | 0.1 ± 0.03 |
| 0.03 maximum | C | 0.03 maximum |
| balance | Ni | balance |

25. A mineral insulated metal-sheathed (MIMS) cable, comprising:
a thermoelement wire made of a nickel-based alloy, said thermoelement wire having an oxidation retardant defined by a passivating oxide film formed by subjecting said thermoelement wire to heat treatment at high temperature in an atmosphere of very low oxygen partial pressure and then allowing said thermoelement wire to cool, and
an alloy sheath surrounding said thermoelement wire.

26. A MIMS cable according to claim 25, wherein said thermoelement wire has the following composition, expressed as weight-%:

| Positive Alloy | Elemental Component | Negative Alloy |
|---|---|---|
| 10 to 25 | Cr | 2.0 maximum |
| 1.0 to 10 | Nb | 1.0 to 10 |
| 0.5 to 5.0 | Si | 2.0 to 5.0 |
| 0.5 maximum | Mg | 0.5 maximum |
| 0.1 ± 0.03 | Fe | 0.1 ± 0.03 |
| 0.03 maximum | C | 0.03 maximum |
| balance | Ni | balance |

27. A MIMS cable according to claim 25, wherein said alloy sheath has the following composition, express as weight-%:

| Element | Concentration (wt. %) |
|---|---|
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

28. A MIMS cable according to claim 26, wherein said alloy sheath has the following composition, express as weight-%:

| Element | Concentration (wt. %) |
|---|---|
| Cr | 14.0 ± 0.5 |
| Nb | 3.5 ± 1.5 |
| Si | 1.4 ± 0.1 |
| Mg | 0.15 ± 0.05 |
| Ce | 0.05 ± 0.05 |
| Ni | balance |

* * * * *